United States Patent
Hughes et al.

(10) Patent No.: US 12,420,673 B2
(45) Date of Patent: Sep. 23, 2025

(54) TEMPERATURE BASED CONTROL OF VEHICLE BATTERY

(71) Applicant: FORD GLOBAL TECHNOLOGIES, LLC, Dearborn, MI (US)

(72) Inventors: Justin T. Hughes, Allen Park, MI (US); Marcelo Araujo Xavier, Belleville, MI (US)

(73) Assignee: Ford Global Technologies, LLC, Dearborn, MI (US)

( * ) Notice: Subject to any disclaimer, the term of this patent is extended or adjusted under 35 U.S.C. 154(b) by 901 days.

(21) Appl. No.: 17/591,950

(22) Filed: Feb. 3, 2022

(65) Prior Publication Data

US 2023/0246257 A1    Aug. 3, 2023

(51) Int. Cl.
| | |
|---|---|
| *B60L 58/25* | (2019.01) |
| *B60L 3/00* | (2019.01) |
| *B60L 3/12* | (2006.01) |
| *B60L 58/24* | (2019.01) |
| *G01R 31/36* | (2020.01) |
| *H01M 10/48* | (2006.01) |

(52) U.S. Cl.
CPC .......... B60L 58/25 (2019.02); B60L 3/0038 (2013.01); B60L 3/0046 (2013.01); B60L 3/12 (2013.01); B60L 58/24 (2019.02); G01R 31/3648 (2013.01); H01M 10/486 (2013.01); *B60L 2240/545* (2013.01); *H01M 2220/20* (2013.01)

(58) Field of Classification Search
CPC ...... B60L 58/25; B60L 3/0038; B60L 3/0046; B60L 3/12; B60L 58/24; B60L 2240/545; G01R 31/3648; H01M 10/486; H01M 2220/20
See application file for complete search history.

(56) References Cited

U.S. PATENT DOCUMENTS

| | | | |
|---|---|---|---|
| 6,424,157 B1 * | 7/2002 | Gollomp | B60L 58/16 |
| | | | 324/426 |
| 9,893,394 B2 | 2/2018 | Shin et al. | |
| 10,230,137 B2 | 3/2019 | Lin et al. | |
| 10,741,889 B2 | 8/2020 | Newman et al. | |
| 11,909,019 B2 * | 2/2024 | Burkell | B60L 58/26 |
| 2010/0019729 A1 * | 1/2010 | Kaita | H02J 7/1423 |
| | | | 320/134 |
| 2012/0158228 A1 * | 6/2012 | Biondo | B60L 3/12 |
| | | | 701/22 |
| 2013/0289812 A1 * | 10/2013 | Anzicek | B60L 58/10 |
| | | | 701/22 |
| 2014/0041826 A1 * | 2/2014 | Takeuchi | B60L 1/08 |
| | | | 165/10 |
| 2016/0243958 A1 * | 8/2016 | Miller | B60L 58/13 |
| 2017/0010332 A1 * | 1/2017 | Kagami | G01R 31/374 |
| 2017/0117725 A1 | 4/2017 | Hendricks et al. | |
| 2019/0217721 A1 * | 7/2019 | Marcicki | H01M 10/613 |
| 2020/0164763 A1 | 5/2020 | Holme | |

(Continued)

Primary Examiner — Dale W Hilgendorf
(74) Attorney, Agent, or Firm — David B. Kelley; Brooks Kushman P.C.

(57) ABSTRACT

After start of a vehicle following a parking event having a duration that exceeds a duration threshold, a controller may adjust a maximum output power of a traction battery responsive to temperatures of the traction battery, derived from a temperature of the traction battery at a beginning of the parking event, ambient temperature during the parking event, and the duration, exceeding a first threshold difference.

13 Claims, 2 Drawing Sheets

(56) References Cited

U.S. PATENT DOCUMENTS

| | | | |
|---|---|---|---|
| 2020/0189554 A1* | 6/2020 | Yoo | F02N 11/14 |
| 2021/0359348 A1* | 11/2021 | Zheng | H02J 7/0068 |
| 2022/0271363 A1* | 8/2022 | Burkell | B60L 58/16 |
| 2023/0094431 A1* | 3/2023 | Zhao | B60L 1/02 |
| | | | 701/22 |

* cited by examiner

TEMPERATURE BASED CONTROL OF VEHICLE BATTERY

TECHNICAL FIELD

The present disclosure relates to measuring/estimating battery cell temperatures of an electric vehicle.

BACKGROUND

Electric vehicles rely on one or more traction batteries supplying power to an electric motor to propel the vehicle. The traction battery may include a plurality of battery cells. The battery cell temperature increases when the vehicle is driven. When the vehicle is parked after being driven for a while, the battery cells may be cooled down by the cooler ambient air. In general, the cells located at the end of the battery pack cool down faster than those cells located in the middle of the battery pack due to their proximity to the outer surface of the battery pack. It may not be feasible to have a thermistor on each battery cell.

SUMMARY

A vehicle includes a traction battery having a plurality of cells configured to store electric energy, and a controller. The controller, after start of the vehicle following a parking event having a duration that exceeds a duration threshold, reduces a maximum output power of the traction battery responsive to temperatures of the traction battery, derived from a temperature of the traction battery when the parking event begins, ambient temperature when the parking event begins, ambient temperature when the parking event ends, and the duration, exceeding a first threshold difference.

A vehicle includes a traction battery that stores electric energy, and a controller. The controller, after start of the vehicle following a parking event having a duration that exceeds a threshold, reduces a maximum output power of the traction battery based on a temperature of the traction battery at a beginning of the parking event, ambient temperature at the beginning of the parking event, ambient temperature at an end of the parking event, and the duration, and after start of the vehicle following a parking event having a duration that does not exceed the threshold, precludes reduction of the maximum output power of the traction battery.

A method for a vehicle includes, after start of the vehicle following a parking event having a duration that exceeds a duration threshold, adjusting a maximum output power of a traction battery responsive to temperatures of the traction battery, derived from a temperature of the traction battery at a beginning of the parking event, ambient temperature during the parking event, and the duration, exceeding a first threshold difference.

DETAILED DESCRIPTION

Embodiments are described herein. It is to be understood, however, that the disclosed embodiments are merely examples and other embodiments may take various and alternative forms. The figures are not necessarily to scale. Some features could be exaggerated or minimized to show details of particular components. Therefore, specific structural and functional details disclosed herein are not to be interpreted as limiting, but merely as a representative basis for teaching one skilled in the art.

Various features illustrated and described with reference to any one of the figures may be combined with features illustrated in one or more other figures to produce embodiments that are not explicitly illustrated or described. The combinations of features illustrated provide representative embodiments for typical applications. Various combinations and modifications of the features consistent with the teachings of this disclosure, however, could be desired for particular applications or implementations.

The present disclosure, among other things, proposes a system and method for measuring/estimating the temperature of a plurality of battery cells of an electric vehicle.

Figure 1:
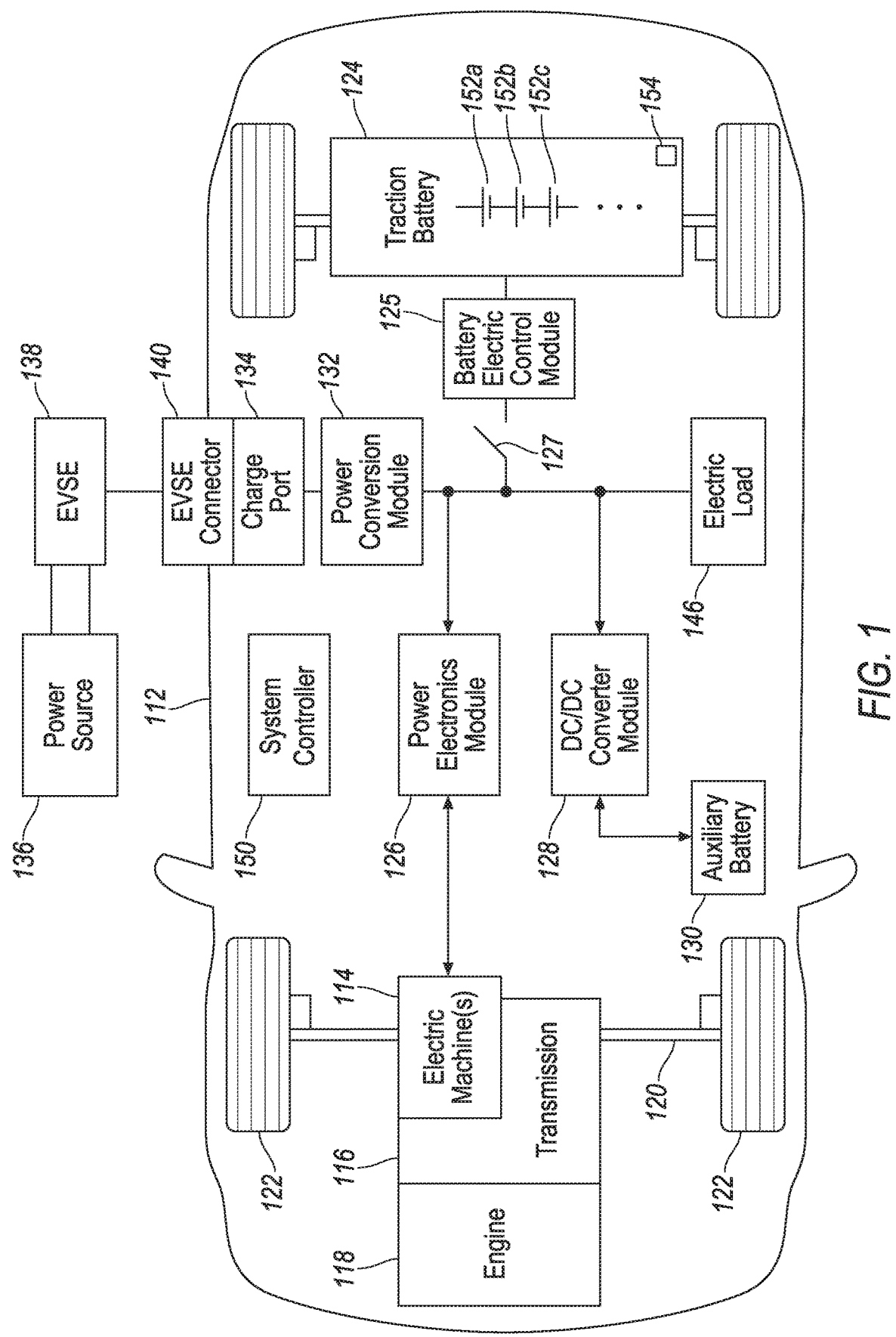
FIG. 1 illustrates an example block topology of an electrified vehicle illustrating drivetrain and energy storage components.

FIG. 1 illustrates a plug-in hybrid-electric vehicle (PHEV). A plug-in hybrid-electric vehicle 112 may include one or more electric machines (electric motors) 114 mechanically coupled to a hybrid transmission 116. The electric machines 114 may be capable of operating as a motor or a generator. In addition, the hybrid transmission 116 is mechanically coupled to an engine 118. The hybrid transmission 116 is also mechanically coupled to a drive shaft 120 that is mechanically coupled to wheels 122. The electric machines 114 may provide propulsion and slowing capability when the engine 118 is turned on or off. The electric machines 114 may also act as generators and may provide fuel economy benefits by recovering energy that would be lost as heat in the friction braking system. The electric machines 114 may also reduce vehicle emissions by allowing the engine 118 to operate at more efficient speeds and allowing the hybrid-electric vehicle 112 to be operated in electric mode with the engine 118 off under certain conditions.

A traction battery or battery pack 124 stores energy that may be used by the electric machines 114. A vehicle battery pack 124 may provide a high voltage DC output. The traction battery 124 may be electrically coupled to one or more battery electric control modules/battery energy control modules (BECM) 125. The BECM 125 is also know as the battery management system (BMS) 125. The BECM 125 may be provided with one or more processors and software applications configured to monitor and control various operations of the traction battery 124. The traction battery 124 may be further electrically coupled to one or more power electronics modules 126. The power electronics module 126 may also be referred to as a power inverter. One or more contactors 127 may isolate the traction battery 124 and the BECM 125 from other components when opened and couple the traction battery 124 and the BECM 125 to other components when closed. The power electronics module 126 may also be electrically coupled to the electric machines 114 and provide the ability to bi-directionally transfer energy between the traction battery 124 and the electric machines 114. For example, a traction battery 124 may provide a DC voltage while the electric machines 114 may operate using a three-phase AC current. The power electronics module 126 may convert the DC voltage to a three-phase AC current for use by the electric machines 114. In a regenerative mode, the power electronics module 126 may convert the three-phase AC current from the electric machines 114 acting as generators to DC voltage compatible with the traction battery 124. The description herein is equally applicable to a pure electric vehicle. For a pure electric vehicle, the hybrid transmission 116 may be a gear box connected to the electric machine 114 and the engine 118 may not be present.

In addition to providing energy for propulsion, the traction battery 124 may provide energy for other vehicle electrical systems. A vehicle may include a DC/DC converter module 128 that converts the high voltage DC output of the traction battery 124 to a low voltage DC supply that is compatible with other low-voltage vehicle loads. An output of the DC/DC converter module 128 may be electrically coupled to an auxiliary battery 130 (e.g., 12V battery).

The vehicle 112 may be a battery electric vehicle (BEV) or a plug-in hybrid electric vehicle (PHEV) in which the traction battery 124 may be recharged by an external power source 136. The external power source 136 may be a connection to an electrical outlet. The external power source 136 may be an electrical power distribution network or grid as provided by an electric utility company. The external power source 136 may be electrically coupled to electric vehicle supply equipment (EVSE) 138. The EVSE 138 may provide circuitry and controls to manage the transfer of energy between the power source 136 and the vehicle 112. The external power source 136 may provide DC or AC electric power to the EVSE 138. The EVSE 138 may have a charge connector 140 for plugging into a charge port 134 of the vehicle 112. The charge port 134 may be any type of port configured to transfer power from the EVSE 138 to the vehicle 112. The charge port 134 may be electrically coupled to a charger or on-board power conversion module 132. The power conversion module 132 may condition the power supplied from the EVSE 138 to provide the proper voltage and current levels to the traction battery 124. The power conversion module 132 may interface with the EVSE 138 to coordinate the delivery of power to the vehicle 112. The EVSE connector 140 may have pins that mate with corresponding recesses of the charge port 134. Alternatively, various components described as being electrically coupled may transfer power using a wireless inductive coupling.

One or more electrical loads 146 may be coupled to the high-voltage bus. The electrical loads 146 may have an associated controller that operates and controls the electrical loads 146 when appropriate. Examples of electrical loads 146 may be a heating module, an air-conditioning module, or the like.

The various components discussed may have one or more associated controllers to control and monitor the operation of the components. The controllers may communicate via a serial bus (e.g., Controller Area Network (CAN)) or via discrete conductors. A system controller 150 may be present to coordinate the operation of the various components. For instance, the system controller 150 may include a powertrain control module (PCM) configured to operate the powertrain of the vehicle 112. It is noted that the system controller 150 is used as a general term and may include one or more controller devices configured to perform various operations in the present disclosure. For instance, the system controller 150 may be programmed to enable a powertrain control function to operate the powertrain of the vehicle 112. The system controller 150 may be further programmed to enable a telecommunication function with various entities (e.g. a server) via a wireless network (e.g. a cellular network).

The system controller 150 and/or BECM 125, individually or combined, may be programmed to perform various operations with regard to the traction battery 124. For instance, the system controller 150 and/or BECM 125 may be configured to measure and determine the temperature of various cells 152 via one or more temperature sensors 154. The temperature sensor 154 may be implemented in various manners. For instance, the temperature sensors 154 may include one or more thermistors configured to measure the temperature of the battery cells 152 using the resistance of a resistor. As illustrated in FIG. 1, the traction battery pack 124 includes a plurality of battery cells 152 connected in series. Depending on the specific design need, the battery cells 152 may have the same or different specifications (e.g. capacity, voltage or the like). It is noted that the term cell is used as a general term in the present disclosure and may refer to an individual cell and/or an array of cells configured to store electric energy. One of more temperature sensors 154 may be installed in the traction battery 124 to measure the temperature near one or more cells 152. If multiple temperature sensors 154 are provided, the temperature sensors 154 may be positioned at different locations of within the battery pack 124 to measure the temperatures at those locations. The cell temperatures may vary by the locations within the battery pack 124. In general, the cell temperature at outer cells (i.e. cells located near the outer surface of the battery pack 124) may be lower than the temperature at middle cells (i.e. cells located far from the outer surface of the battery pack 124) due to the proximity from the outer surface of the battery pack 124 that may be cooled down by the ambient air having a lower temperature. The temperature deviation/gradient may be more significant when the ambient temperature is cold after the vehicle 112 has recently been used because the cold ambient air may cool down the outer cells 152 faster. In addition, due to the limited physical size of the battery pack 124 and an increased expense for adding more sensors 154, only a given number of temperature sensors 154 may be placed in the battery pack 124. Further, adding more temperature sensors 154 in the battery 124 may affect the pack architecture and increase sensor placement difficulties. In other words, there may be situations in which the system controller 150 and/or BECM 125 may be unable to directly measure the temperature of a given cell 152 because no sensor 154 is installed at the given cell location. Without knowing the temperature of a particular cell 152, the system controller 150 and/or BECM 125 may be unable to operate the vehicle 112 efficiently.

Figure 2:
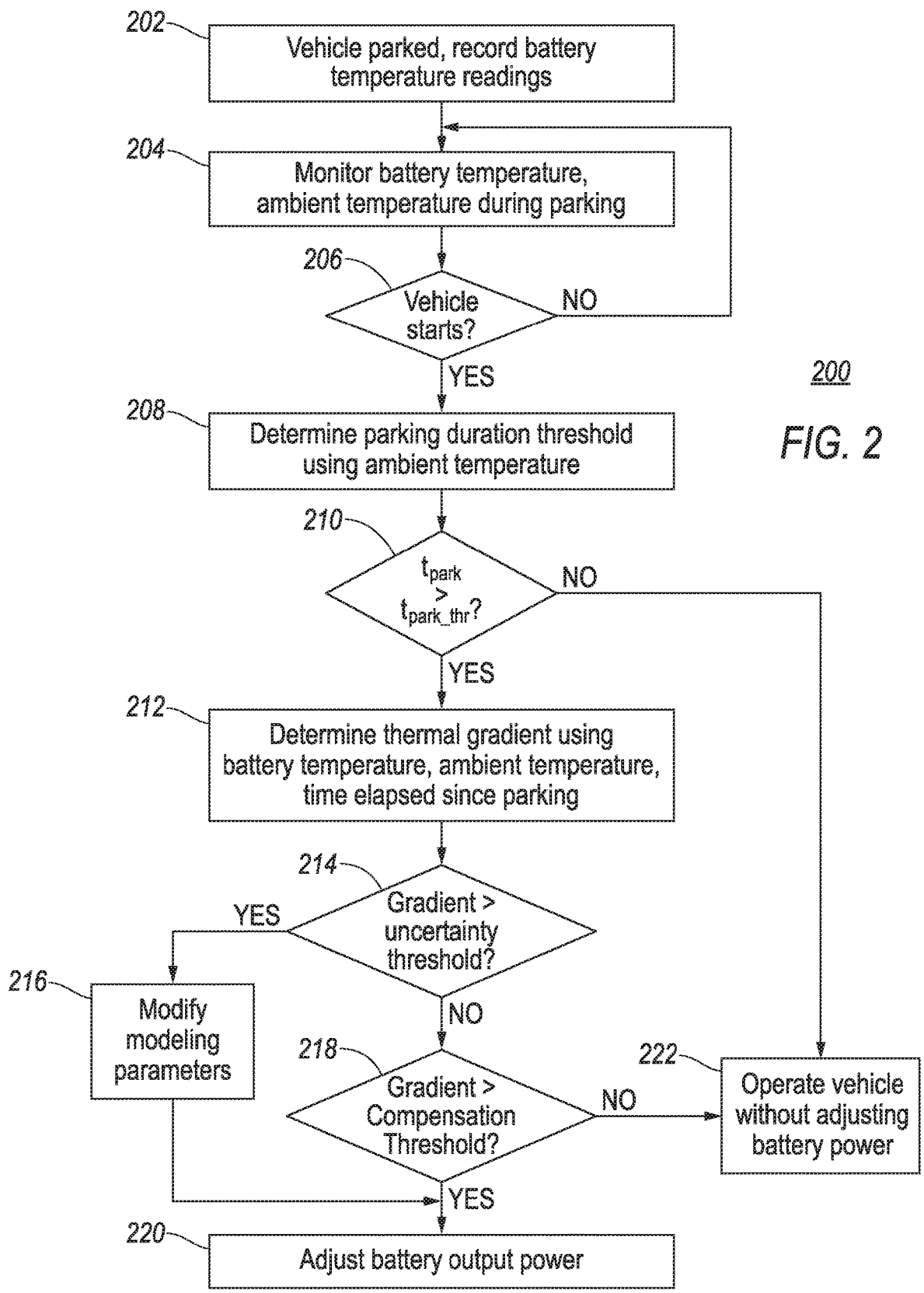
FIG. 2 illustrates an example flow diagram of a process for measuring/estimating the battery temperature of a vehicle.

Referring to FIG. 2, an example flow diagram 200 of a process for measuring vehicle battery temperature and operating the vehicle 112 is illustrated. With continuing reference to FIG. 1, the process 200 may be implemented via system controller 150 and/or BECM 125 individually or collectively. For simplicity purposes, the following description will be made with reference to the BECM 125. At operation 202, responsive to detecting the vehicle has parked after a trip, the BECM 125 records the current battery temperature readings from the temperature sensors 154 and/or cell temperature estimates for future reference. At operation 204, the BECM 125 monitors and records various data while the vehicle is parked until the next trip. For instance, the data monitored and recorded may include the battery temperature and the ambient temperature. The BECM 125 may sample the battery temperature and the ambient temperature at a predetermined time interval (e.g. every 10 minutes) to determine a pattern of the temperatures. Additionally, or alternatively, the BECM 125 may obtain the ambient temperature from a cloud server via a transceiver (not shown) of the vehicle 112. In an alternative example, the BECM 125 may only need the ambient temperature at the beginning and the end of the parking event without requiring the ambient temperature during the entire parking event. For instance, during the cold weather reflected by the ambient temperature, the battery cell temperature may exhibit a pattern in which the outer battery cells 152 lose heat significantly faster than the inner cells 152. In contrast, when the ambient temperature is hot, the temperature deviation/gradient between the inner and outer cells may be less significant. At operation 206, the BECM 125 verifies if the vehicle has been started for the next trip. If the answer is No, the process returns to operation 204 and the BECM 125 continues to monitor the data while the vehicle is parked. Otherwise, if the answer is Yes, the process proceeds to operation 208 and the BECM 125 determines parking duration threshold using the ambient temperature. As discussed above, if the ambient temperature is high, the cell temperatures at different cell locations of the battery 124 may not deviate significantly and therefore it may not be necessary to perform the following operations to adjust the operation of the battery 124. If otherwise the ambient temperature is cold, the following operation may be preferred. In addition, the cell temperature deviation is further dependent on the duration of the parking. In general, a longer parking duration at colder climate may result in a greater battery cell temperature deviation compared with a shorter parking duration at hotter climate. If the vehicle has only been parked for a short period of time (e.g. a few minutes), the battery cell temperature deviation may be insignificant to justify the battery operation adjustment. The parking duration threshold may be adjusted using various factors. For instance, the BECM 125 may determine and adjust the parking duration threshold using the ambient temperature. Responsive to a colder ambient temperature, the BECM 125 may reduce the parking duration threshold. Responsive to a hotter ambient temperature, the BECM 125 may increase the parking duration threshold.

At operation 210, the BECM 125 determine if the vehicle 112 has parked longer than the duration threshold. If the answer is No, the process proceeds to operation 222 and the BECM 125 may operate the vehicle 112 without adjusting the battery output parameters. Additionally, the BECM 125 may further compare the parking duration with an upper threshold (e.g. 12 hours). If the parking duration exceeds the upper threshold, an assumption that the battery cell temperature is equal to the ambient temperature may be made and therefore the cell temperature estimation process may be unnecessary. Otherwise, if the answer is Yes, the process proceeds to operation 212 and the BECM 125 determines a thermal gradient using the previously recorded battery temperatures and ambient temperatures, as well as the time elapsed since the vehicle has last been used. For instance, a lumped capacitance thermal model may be used to estimate the temperatures of those cells 152 that are not provided with the temperature sensor 154 for direct temperature measurement. With those temperatures of cells both measured and determined, the thermal gradient may be determined. The thermal gradient may be indicative of a deviation in temperature between a battery cell 152 having the highest temperature and a battery cell 152 having the lowest temperature. Additionally, or alternatively, the thermal gradient may be indicative of a magnitude of temperature deviation from one or more sensor measured temperatures of one or more battery cells 152. Depending on the configuration of the mathematical model used to determine the thermal gradient, the estimated temperature may not be accurate in some situations and the thermal gradient may be used to reflect the uncertainty to allow the BECM 125 to make further adjustment to improve the accuracy of the temperature estimation. The thermal gradient may be generated in the form of a temperature value and compared with an uncertainty threshold (e.g. 10° C.) at operation 214. If the answer is Yes, indicative of the uncertainty being high, the process 200 proceeds to operation 216 and the BECM 125 modifies the modeling parameters to adjust the thermal gradient for further estimations. For instance, the BECM 125 may adjust the internal resistance modeling parameter of the traction battery 124 which is dependent upon the temperature. The BECM 125 may further adjust parameters representing modeling uncertainties to improve the accuracy of the estimation. In case an extended Kalman filter model is used, the BECM 125 may adjust the process noise co-variance, and/or observation co-variance to improve the certainty of the model. If the answer for operation 214 is No, the process proceeds to operation 218 and the BECM 125 compares the thermal gradient with a compensation threshold (e.g. 3° C.) that is less than the uncertainty threshold to determine if an adjustment/compensation for the battery operation is required. If the answer is No, the process proceeds to operation 222. Otherwise, if the answer is Yes, the process proceeds to operation 220 and the BECM 125 adjusts the battery parameters (e.g. power output) to operate the vehicle 112 based on the thermal gradient estimation such that the vehicle 112 may be operated in a more efficient manner. For instance, responsive to detecting the compensation is needed, the BECM 125 may reduce the maximum output of the traction battery 124 at the beginning of the trip until the battery temperature at different cell locations reaches a relatively uniform status. The BECM 125 may be configured to determine the maximum output using the temperature of the coldest cell (directly measured or calculated).

The algorithms, methods, or processes disclosed herein can be deliverable to or implemented by a computer, controller, or processing device, which can include any dedicated electronic control unit or programmable electronic control unit. Similarly, the algorithms, methods, or processes can be stored as data and instructions executable by a computer or controller in many forms including, but not limited to, information permanently stored on non-writable storage media such as read only memory devices and information alterably stored on writeable storage media such as compact discs, random access memory devices, or other magnetic and optical media. The algorithms, methods, or processes can also be implemented in software executable objects. Alternatively, the algorithms, methods, or processes can be embodied in whole or in part using suitable hardware components, such as application specific integrated circuits, field-programmable gate arrays, state machines, or other hardware components or devices, or a combination of firmware, hardware, and software components.

While exemplary embodiments are described above, it is not intended that these embodiments describe all possible forms encompassed by the claims. The words used in the specification are words of description rather than limitation, and it is understood that various changes may be made without departing from the spirit and scope of the disclosure.

As previously described, the features of various embodiments may be combined to form further embodiments of the invention that may not be explicitly described or illustrated. While various embodiments could have been described as providing advantages or being preferred over other embodiments or prior art implementations with respect to one or more desired characteristics, those of ordinary skill in the art recognize that one or more features or characteristics may be compromised to achieve desired overall system attributes, which depend on the specific application and implementation. These attributes may include, but are not limited to strength, durability, marketability, appearance, packaging, size, serviceability, weight, manufacturability, ease of assembly, etc. As such, embodiments described as less desirable than other embodiments or prior art implementations with respect to one or more characteristics are not outside the scope of the disclosure and may be desirable for particular applications.

What is claimed is:

1. A vehicle comprising:
   a traction battery having a plurality of cells configured to store electric energy; and
   a controller programmed to, after start of the vehicle following a parking event having a duration that exceeds a duration threshold, reduce a maximum output power of the traction battery based on a sensed temperature of the traction battery when the parking event begins, a sensed ambient temperature when the parking event begins, a sensed ambient temperature when the parking event ends, and the duration.

2. The vehicle of claim 1, wherein the duration threshold is derived from the ambient temperature when the parking event begins such that a higher the ambient temperature when the parking event begins, a greater the duration threshold.

3. The vehicle of claim 1, wherein the controller is further programmed to, responsive to detecting the parking event, record the temperature of the traction battery when the parking event begins in a storage device.

4. The vehicle of claim 1 further comprising an ambient temperature sensor configured to sample the ambient temperatures.

5. A vehicle comprising:
   a traction battery configured to store electric energy; and
   a controller programmed to:
      after start of the vehicle following a parking event having a duration that exceeds a threshold, reduce a maximum output power of the traction battery based on a temperature of the traction battery at a beginning of the parking event, ambient temperature at the beginning of the parking event, ambient temperature at an end of the parking event, and the duration, and
      after start of the vehicle following a parking event having a duration that does not exceed the threshold, preclude reduction of the maximum output power of the traction battery.

6. The vehicle of claim 5, wherein the threshold is derived from the ambient temperature at the end of the parking event such that a higher the ambient temperature at the end of the parking event, a greater the threshold.

7. The vehicle of claim 5, further comprising an ambient temperature sensor configured to sample the ambient temperatures during the parking events.

8. The vehicle of claim 5, further comprising a wireless transceiver configured to obtain data indicative of the ambient temperatures during the parking events.

9. A method for a vehicle comprising:
   after start of the vehicle following a parking event having a duration that exceeds a duration threshold, adjusting a maximum output power of a traction battery based on a temperature of the traction battery at a beginning of the parking event, and ambient temperature during the parking event.

10. The method of claim 9, wherein the duration threshold is derived from the ambient temperature such that a higher ambient temperature results in a greater threshold.

11. The method of claim 9 further comprising responsive to detecting the parking event, recording the temperature of the traction battery at the beginning of the parking event in a storage device.

12. The method of claim 9 further comprising sampling, via an ambient temperature sensor, the ambient temperature during the parking event.

13. The method of claim 9 further comprising obtaining, via a wireless transceiver, data indicative of the ambient temperature from a cloud server.

* * * * *